United States Patent [19]
Dao et al.

[11] Patent Number: 5,384,219
[45] Date of Patent: Jan. 24, 1995

[54] RETICLE WITH STRUCTURALLY IDENTICAL INVERTED PHASE-SHIFTED FEATURES

[75] Inventors: Giang T. Dao, Fremont; Qi De Qian, Santa Clara; Nelson N. Tam, Foster City; Eng T. Gaw, San Jose; Harry H. Fujimoto, Sunnyvale, all of Calif.

[73] Assignee: Intel Corporation, Santa Clara, Calif.

[21] Appl. No.: 114,953

[22] Filed: Aug. 31, 1993

Related U.S. Application Data

[60] Division of Ser. No. 12,564, Feb. 2, 1993, Pat. No. 5,348,826, which is a continuation-in-part of Ser. No. 933,400, Aug. 21, 1992, Pat. No. 5,302,477, which is a continuation-in-part of Ser. No. 933,341, Aug. 21, 1992, Pat. No. 5,300,379.

[51] Int. Cl.$^6$ .................................................. G03F 9/00
[52] U.S. Cl. .......................................... 430/5; 430/311; 430/323
[58] Field of Search .................... 430/311, 269, 5, 323

[56] References Cited

U.S. PATENT DOCUMENTS

| | | | |
|---|---|---|---|
| 4,231,811 | 11/1980 | Somekh et al. | 148/1.5 |
| 4,360,586 | 11/1982 | Flanders et al. | 430/321 |
| 4,890,309 | 12/1989 | Smith et al. | 378/3 |
| 5,045,417 | 9/1991 | Okamoto | 430/5 |
| 5,135,609 | 8/1992 | Pease et al. | 156/654 |
| 5,229,255 | 7/1993 | White | 430/311 |

FOREIGN PATENT DOCUMENTS

| | | |
|---|---|---|
| 0395425 | 10/1990 | European Pat. Off. . |
| 0492630 | 7/1992 | European Pat. Off. . |

OTHER PUBLICATIONS

N. Hasegawa, A. Imai, T. Terasawa, T. Tanaka, F. Murai. *The Japan Society of Applied Physics and Related Societies* "Extended Abstracts 29p-ZC-3, Submicron Lithography Using Phase Mask (9): Halftone Phase Shifting Mask" 1991.

K. Nakagawa, N. Ishiwata, Y. Yanagishita, Y. Tabata. *The Japan Society of Applied Physics and Related Societies* "Extended Abstracts 29p-ZC-2, Phase-Shifting Photolithography Applicable to Real IC Patterns" 1991.

Lin, Burn J. "The Attenuated Phase-Shifting Mask" *Solid State Technology* Jan. 1992.

Andrew R. Neureuther, "Modeling Phase Shifting Masks", Preliminary Version of BACUS Symposium Paper, Dept. of Electrical Engineering and Computer Sciences, University of California Berkeley, Calif. 94720, Sep. 26, 1990 pp. 1-6 and FIGS. 1-13.

*Primary Examiner*—Steve Rosasco
*Attorney, Agent, or Firm*—Blakely, Sokoloff, Taylor & Zafman

[57] ABSTRACT

A phase-shifted reticle with patterns proximate each other having inverted phases for the features and phase-shifting elements, and method of fabricating the reticle. Each of the patterns and inverted patterns are structurally identical with regard to the direction of phase shift, so that any focal shift due to phase error is in the same direction for all patterns. In a preferred embodiment, the structurally identical inverted reticle is used to form an array of closely spaced contact or via openings. For a first pattern on the reticle, the feature will be the 0° phase and the phase-shifting rim surrounding that feature will be the 180° phase. All patterns surrounding the first pattern have phase-shifting rims of the 0° phase and features of the 180° phase. In this way, each pattern can form below conventional resolution features in the resist. Additionally, there will not be exposure of the regions between the closely spaced features since radiation transmitted through the closely spaced phase-shifting rims of the two patterns is 180° out of phase. Also, since each pattern is structurally identical, any focal shift due to phase error is in the same direction for all patterns, so that an acceptable depth of field is maintained for a substrate exposed with the reticle.

14 Claims, 17 Drawing Sheets

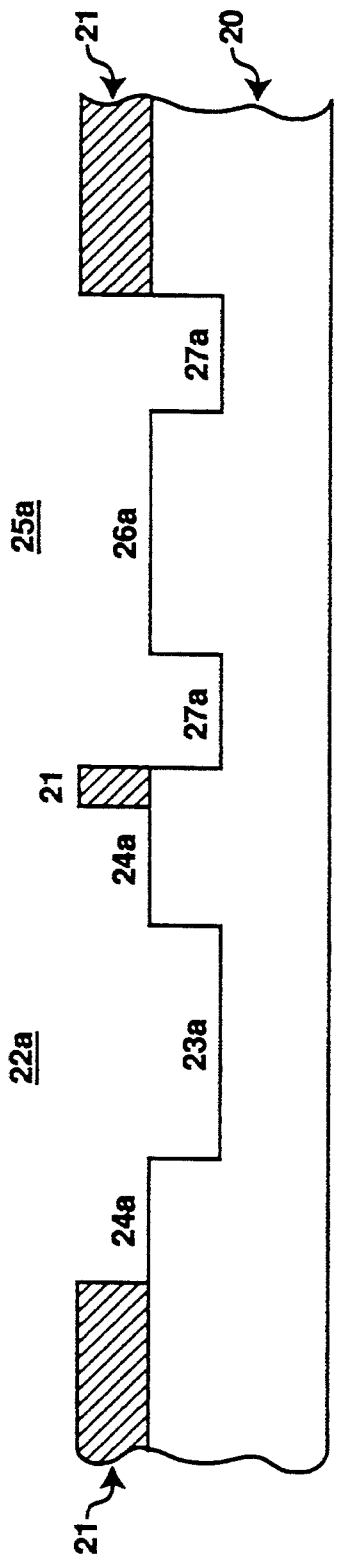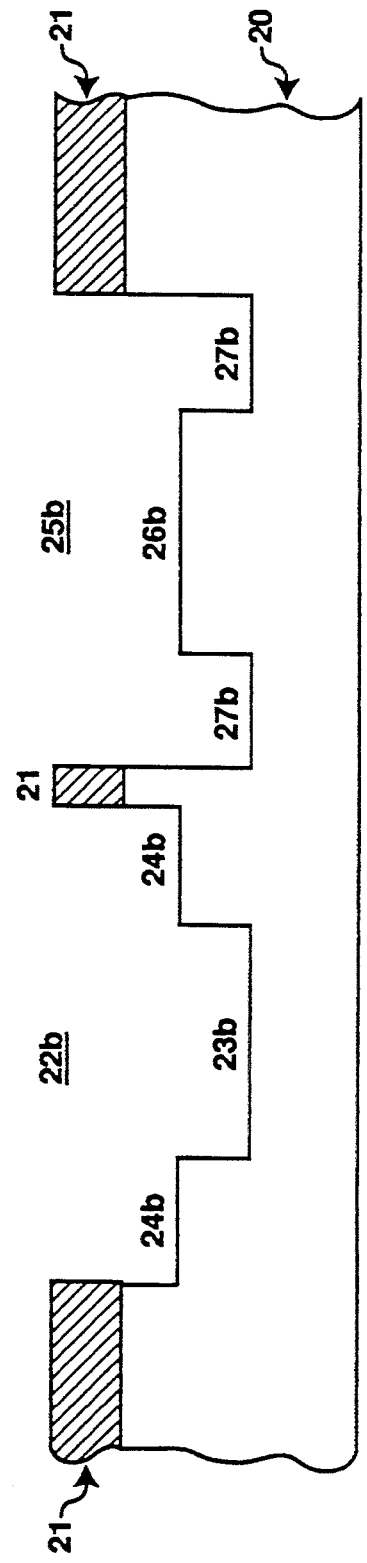

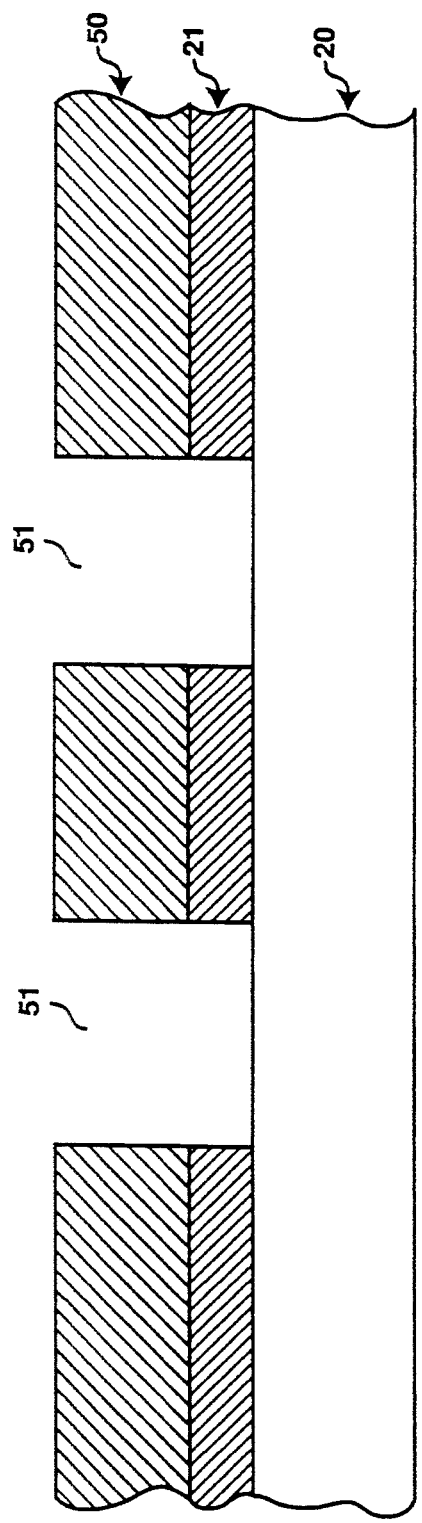
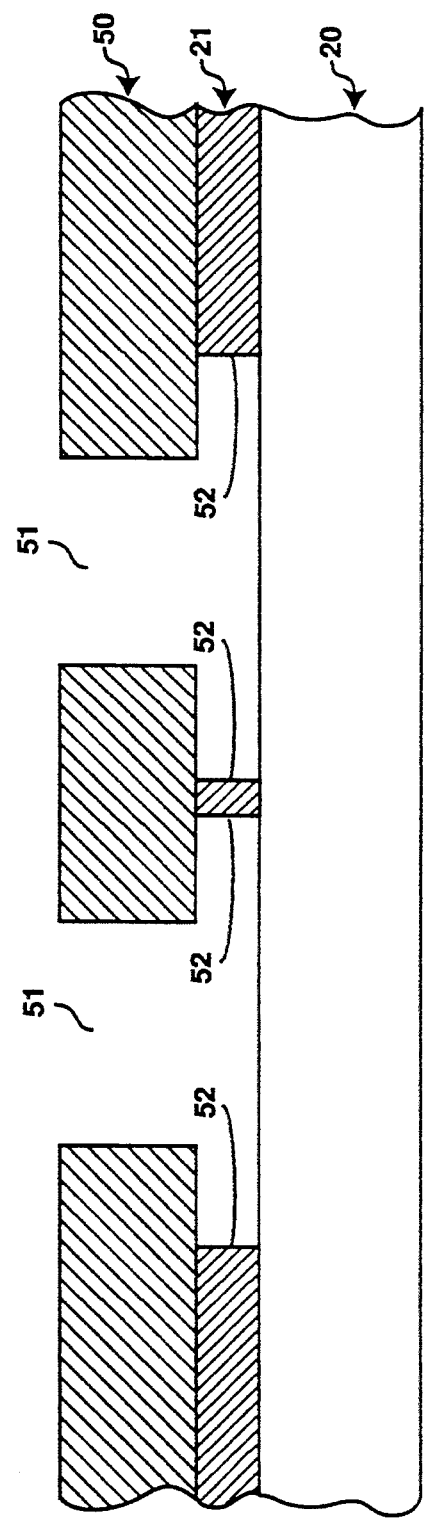
FIGURE 5A
FIGURE 5B

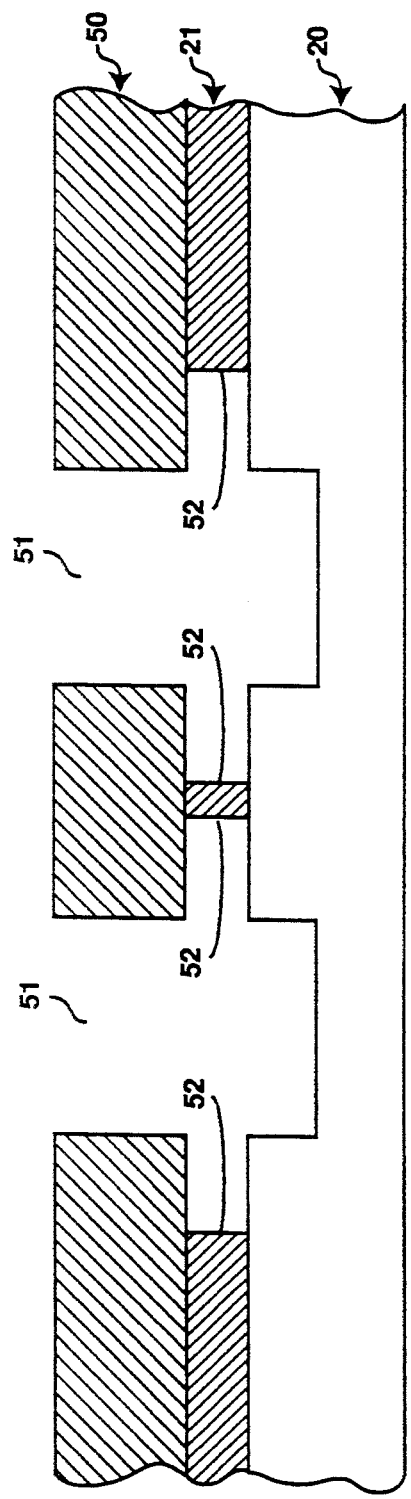
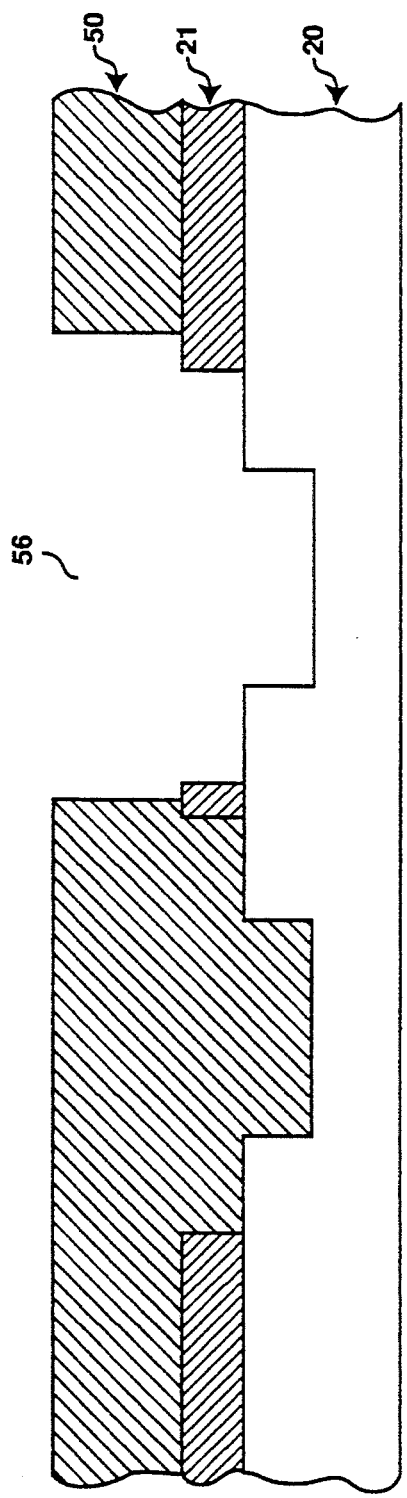
FIGURE 5C
FIGURE 5D

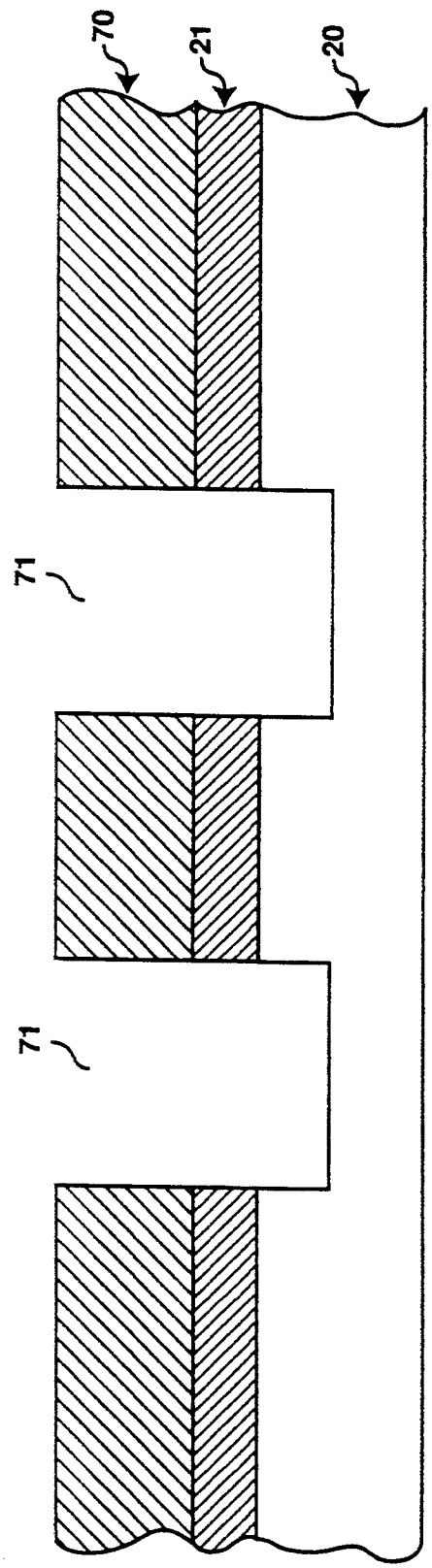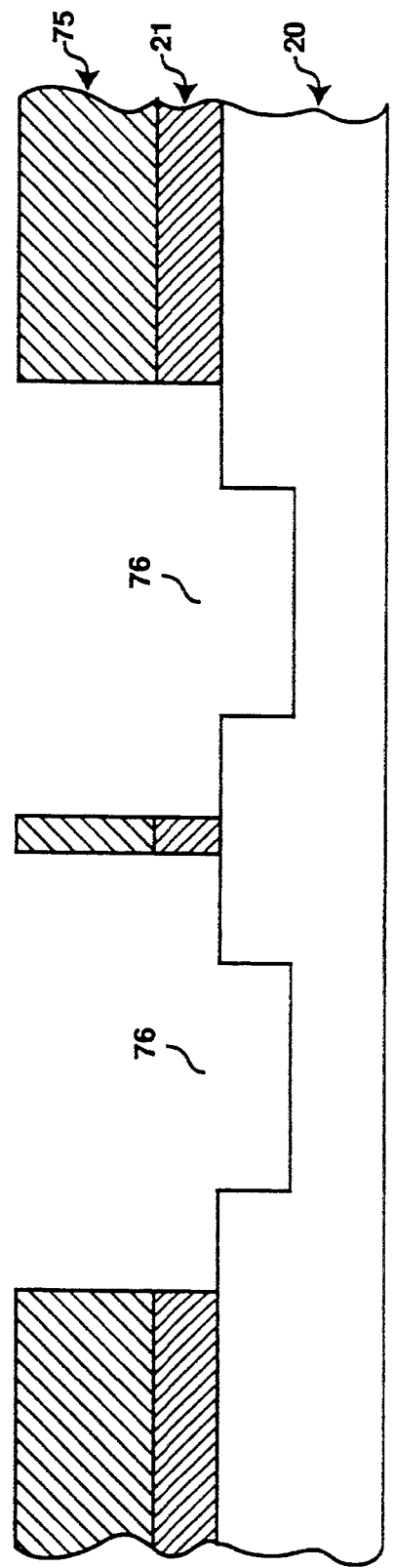

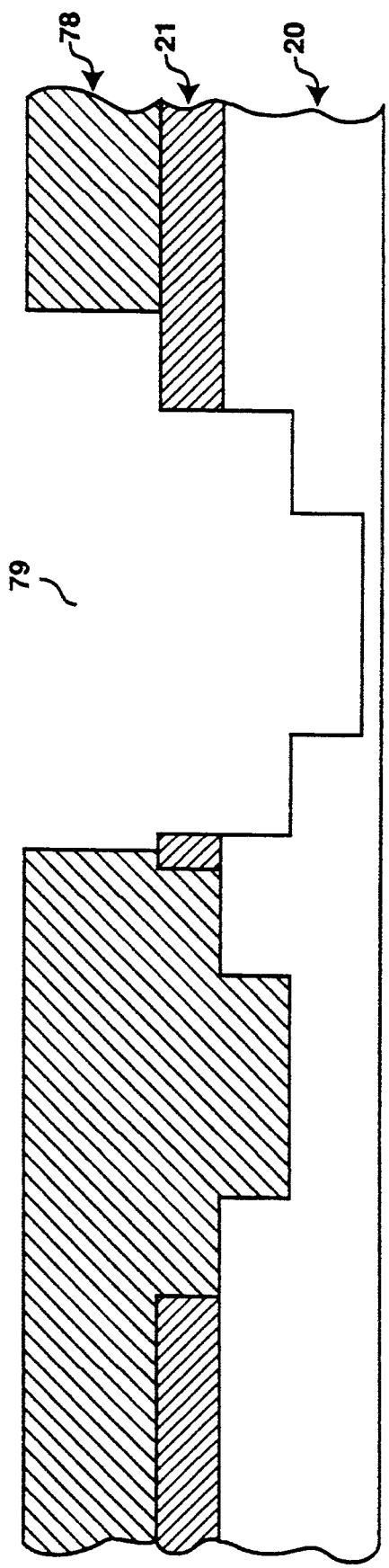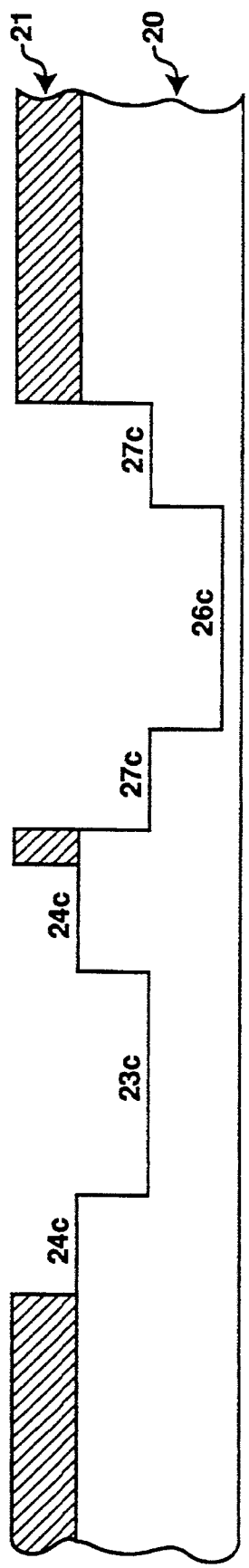
FIGURE 7E
FIGURE 7F

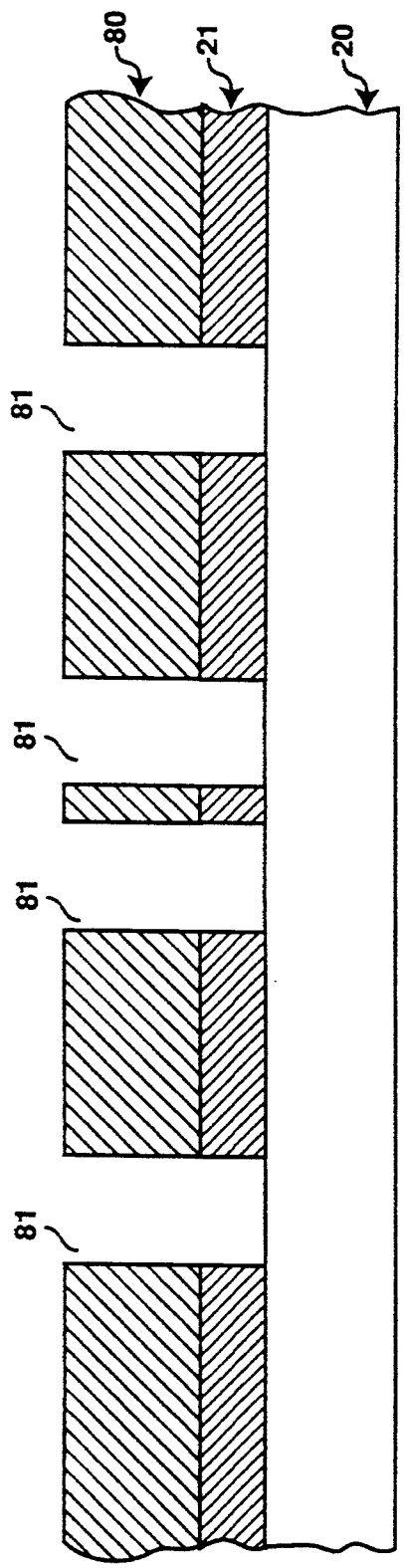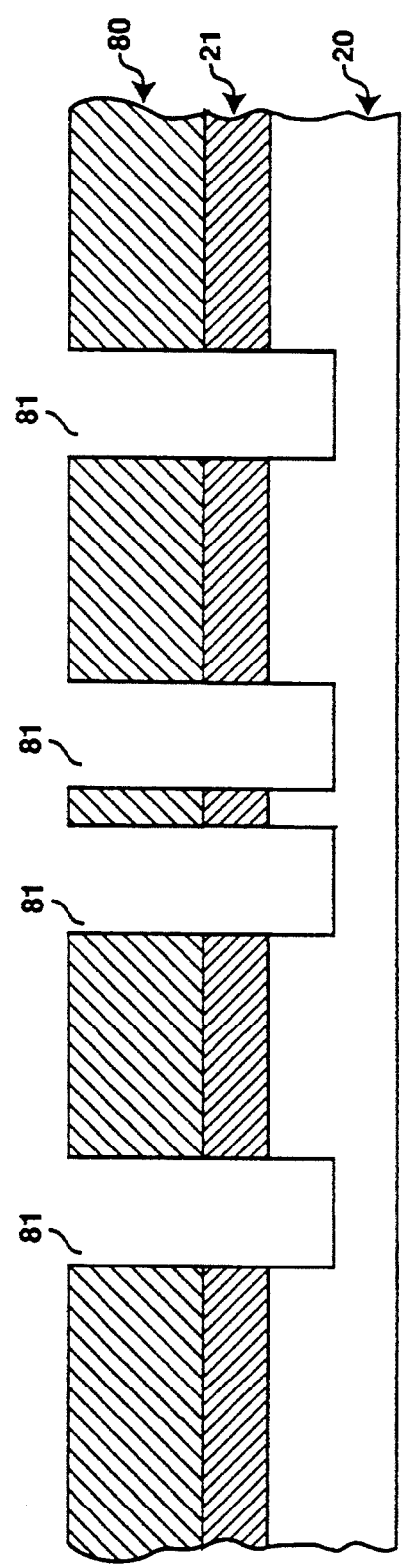
FIGURE 8A
FIGURE 8B

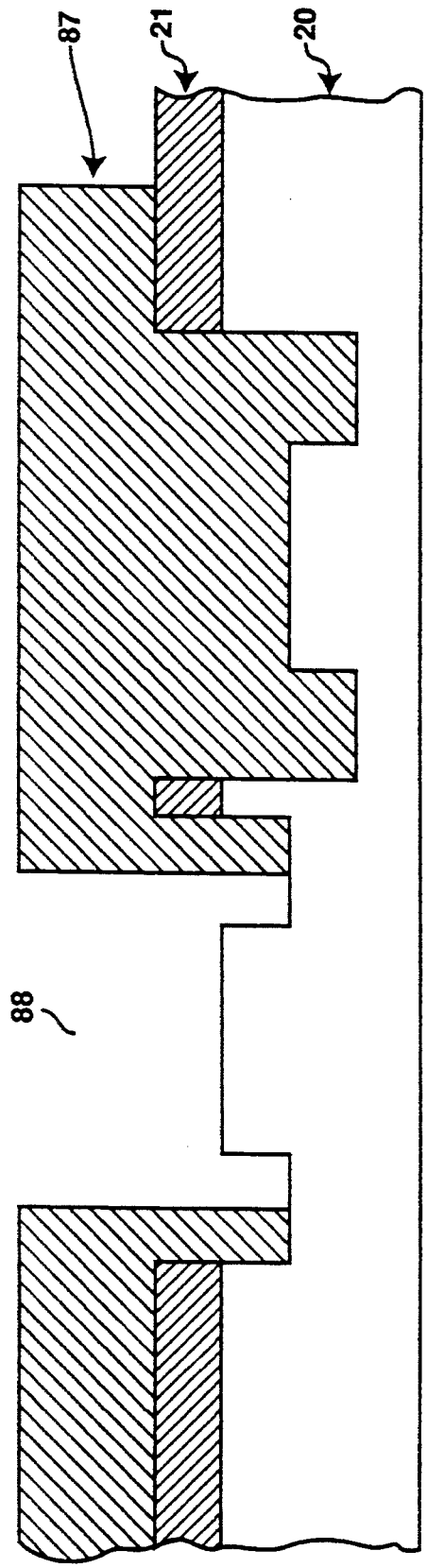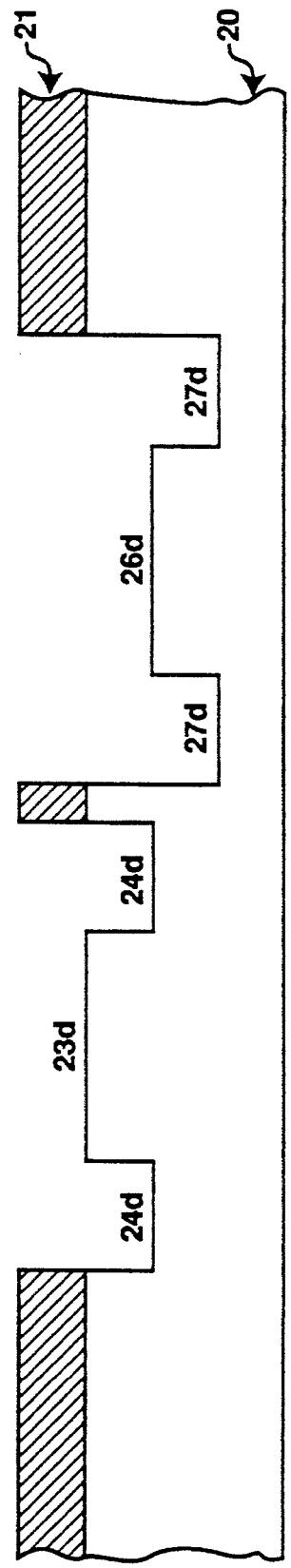
FIGURE 8E
FIGURE 8F

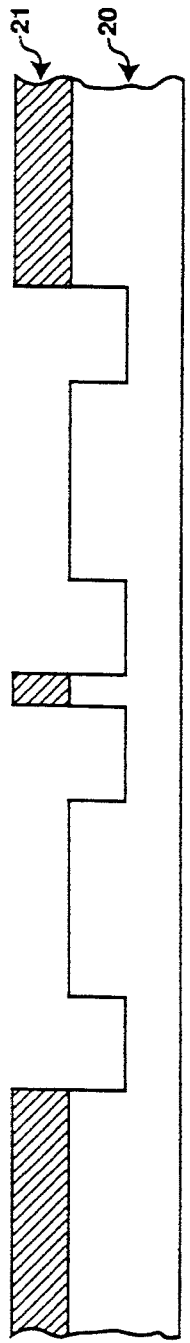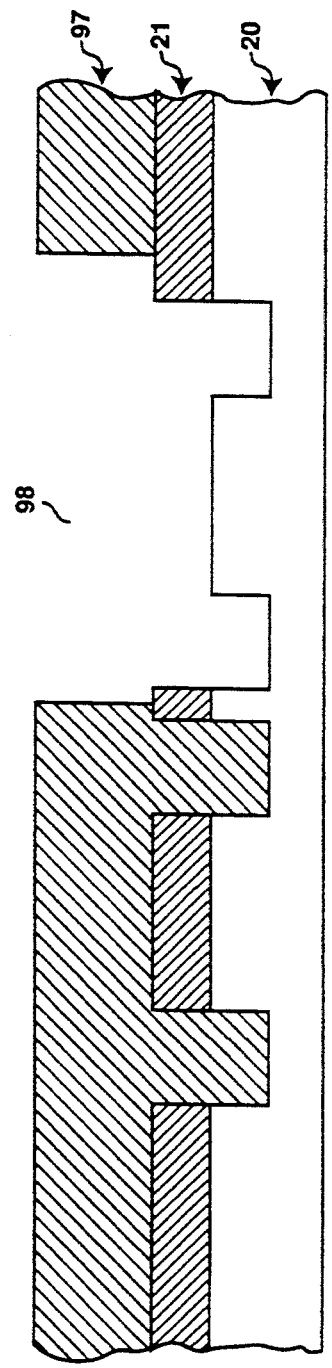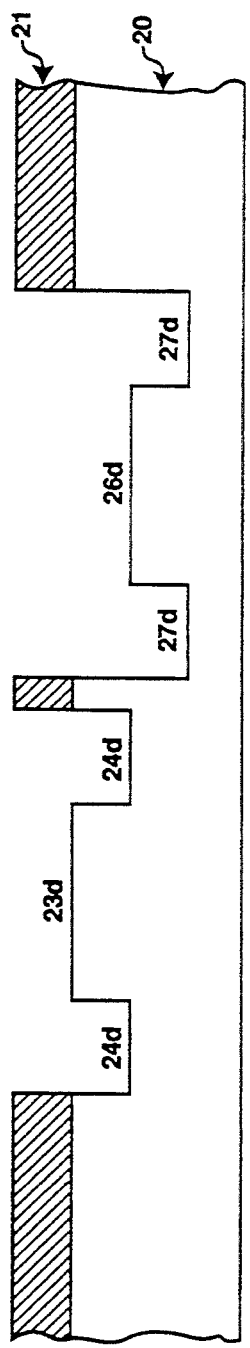

RETICLE WITH STRUCTURALLY IDENTICAL INVERTED PHASE-SHIFTED FEATURES

This is a divisional of application Ser. No. 08/012,564, filed Feb. 2, 1993, now U.S. Pat. No. 5,348,826, which is a continuation-in-part of application Ser. No. 07/933,400, filed Aug. 21, 1992, now U.S. Pat. No. 5,302,477 and which is a continuationin-part of application Ser. No. 07/933,341 filed Aug. 21, 1992, now U.S. Pat. No. 5,300,379.

FIELD OF INVENTION

The present invention relates to reticles used in patterning radiation sensitive layers and more specifically to a reticle having phase-shifted features proximate to structurally identical inverted phase-shifted features.

BACKGROUND OF INVENTION

In the semiconductor industry, there is a continuing effort to increase device density by scaling device size. State of the art devices currently have device features with a dimension well below 1 micron (submicron). To form these features, a photosensitive layer is formed on a substrate or device layer, and is exposed to radiation through a reticle. The reticle typically comprises a substantially transparent base material with an opaque layer having the desired pattern formed thereon, as is well known. At the submicron level, diffraction effects become significant, resulting in exposure of portions of the photoresist layer underlying the opaque layer near the edges of features.

To minimize effects of diffraction, phase-shifted reticles have been used in the prior art. Typically, a phase-shifted reticle has an opening in the opaque layer corresponding to the pattern to be formed. Phase-shifters, which transmit the exposing radiation and shift the phase of the radiation approximately 180° relative to the openings, lie along or near the outer edges of the features. The radiation transmitted through the phase-shifter destructively interferes with radiation from the opening, thereby reducing the intensity of radiation incident on the photoresist surface underlying the opaque layer near a feature edge.

Prior art phase-shifted reticles have a number of problems which limit their ability to be used to pattern some features, however. Often, it is desired to place two features in close proximity to one another. For example, contact or via openings may be placed in a closely spaced array. In prior art phase-shifted reticles, each opening in the array has a phase-shifting rim surrounding it. Since the openings are closely spaced, the phase-shifting rims of two openings may be very close to or in contact with one another. In this case, the phase-shifting rims of the two close opening patterns are roughly equivalent to one very wide rim. Unfortunately, as the phase-shifting rim width is increased, the intensity of radiation underneath the phase-shifting rims increases. The increased intensity causes a deep recession in the developed photoresist layer, and may in fact cause a portion of the photoresist to be removed between two openings. This phenomenon is know as the proximity effect, and it occurs if two phase-shifting rims are positioned at approximately 0.55 λ/NA or less, where λ is the wavelength of the exposing radiation, and NA is the numerical aperture of the lens of the lithographic printer being used.

To overcome this problem, an inverted phase-shifted reticle has been discovered. The inverted phase shifted is described in the above-referenced copending U.S. patent application Ser. No. 07/933,400, which application is assigned to the assignee of the present invention, and which application is hereby incorporated by reference. Several methods of manufacturing the inverted phase-shifted reticle are described in the above-referenced copending U.S. patent application Ser. No. 07/933,341, which application is assigned to the assignee of the present invention, and which application is hereby incorporated by reference. In the inverted phase-shifted reticle, one phase shifted feature is inverted with respect to a proximate phase-shifted feature, such that two adjacent phase-shifters are 180° out of phase with respect to one another. Thus, the improved resolution of phase-shifting is achieved, while at the same time, the proximity effect is greatly reduced or eliminated. An example of the inverted phase-shifted reticle is shown in FIG. 2.

Another phase-shifting approach is the attenuated phase-shifting mask (APSM). Some of the problems of prior art APSMs, and an improved attenuated phase-shifted reticle, are disclosed in co-pending U.S. patent application Ser. No. 07/952,061, filed Sep. 25, 1992, which application is assigned to the assignee of the present invention, and which application is hereby incorporated by reference. One of the problems of prior art APSMs which is solved by the reticle disclosed in Ser. No. 07/952,061, is focal shift in opposite directions.

It has recently been discovered that the problem of a focal shift in opposite directions can occur in certain inverted phase-shifted reticles. The phenomenon of focal shift is explained in reference to FIG. 1A, and the problem of a focal shift in opposite directions is explained in reference to FIG. 1B.

In the following FIGS. 1A and 1B, a graphical representation of defocus versus critical dimension of an opening in a positive photoresist layer is shown. It will be understood that the actual values can vary considerably based upon the feature being formed, exposure parameters, including time and energy of the exposure, printer parameters and other factors. The FIGS. 1A and 1B provide an example for one set of exposure and printer parameters. Referring to FIG. 1A, a graph of critical dimension (CD) in a photoresist layer plotted against defocus (distance between photoresist layer and best or perfect focus) is shown. As can be seen from curve 10 of FIG. 1A, if the image is defocused in either the positive or negative direction, the dimension of an opening in the resist decreases. The decrease in CD is due to the fact that the intensity of the exposing radiation decreases with either positive or negative displacement from perfect focus. If the process specification allows for a CD in the range of 0.3–0.5 microns, then for the example shown in FIG. 1A, the defocus can be in the range of approximately −0.75 μ through +0.75 μ, since the CD varies from about 0.3 μ at −0.75 defocus, to 0.4 μ at 0 μ defocus, and back down to 0.3 μ at +0.75 μ defocus. Outside of this range, the CD falls below 0.3 μ and is outside of the specified range. The range between −0.75 μ and +0.75 μ is the depth of field (DOF), and is shown by the line 11. Thus, so long as the photoresist layer is within this DOF, the CD will be within specification. As is well known, a large DOF is desirable, as the wafer topography and other factors cause the level of the photoresist layer to vary considerably across the exposure field of the printer.

In a phase-shifted reticle, the above-mentioned focal shift occurs, whereby curve 10 shifts as the phase difference between the phase-shifter and the feature varies from 180° (phase error). As described in the above-referenced application Ser. No. 07/952,061, the direction of focal shift depends upon whether the phase-difference between the shifter and the feature is greater or less than 180° (i.e., whether there is positive or negative phase error. For example, for a given feature/shifter relationship, if the phase difference is less than 180°, the curve 10 shifts to the fight. If the phase difference is greater than 180°, the curve 10 shifts to the left. Referring to FIG. 1B, curve 12 shows a plot of CD versus defocus for a feature where the phase difference between the feature and its phase-shifter is less than 180°, and curve 13 shows CD versus defocus for a feature where the phase difference between the feature and its phase-shifter is greater than 180°. The shape of the CD versus defocus curve does not change significantly due to phase error. Rather, the main effect of phase-error is to cause the curve to shift.

The problem caused by focal shift in opposite directions is illustrated in FIG. 1B. Focal shift in opposite directions as used herein means that a single reticle has features for which the curve 10 of FIG. 1A has shifted right and features for which it has shifted left. That is, a reticle with both negative and positive phase-error. On such a reticle, the DOF will be greatly decreased due to the focal shift in opposite directions. As can be seen from FIG. 1B, for those features for which the curve has shifted fight (curve 12), the CD will be below 0.3 $\mu$ if the defocus is approximately 0.5 $\mu$ or greater, while those features for which the curve has shifted left (curve 13) will have a CD below 0.3 $\mu$ if the defocus is approximately $-0.5$ $\mu$ or less. Thus, DOF 14 now extends only from $-0.5$ $\mu$ through $+0.5$ $\mu$ due to the focal shift in opposite directions. This compares to DOF 11 of $-0.75$ $\mu$ through $+0.75$ $\mu$ for a reticle with no focal shift or focal shift in one direction only.

What is needed is a phase-shifted reticle allowing for patterns having a phase-shifting element to be placed closely together without causing an unacceptable increase in exposure intensity between the patterns, and without having focal shift in the opposite direction from one another.

SUMMARY OF THE INVENTION

A phase-shifted reticle having structurally identical closely spaced features with phase-shifting elements is disclosed. In a preferred embodiment, the phase-shifted reticle of the present invention comprises a plurality of rim phase-shifted opening patterns in a closely spaced array. The opening and phase-shifting rim of each pattern is inverted with respect to all adjacent contact patterns. Thus, if a given opening is considered the 0° phase and its phase-shifting rim the 180° phase, all adjacent patterns have a phase-shifting rim of the 0° phase and openings of the 180° phase. In this way, each contact formed has an equivalent performance of an isolated rim phase-shifted contact, without suffering the proximity effect described earlier. Additionally, all proximate rim and inverted rim phase-shifted patterns are structurally identical, such that if there is any phase error, the focal shift for all patterns will be in the same direction.

Several methods of fabricating the invented mask are disclosed. Each method has one or more advantages. Some methods do not require a chrome undercut etch, which may be unreliable. Some methods are virtually self-aligned, in that no precision alignment steps on an E-beam system are required. Some of the methods do not require unconventional CAD elements such as rim or doughnut shaped features. Some of the methods introduce a 360° phase-shifted region which serves as the 0° phase.

BRIEF DESCRIPTION OF THE DRAWINGS

The present invention is illustrated by way of example and not limitation in the accompanying figures in which:

FIGS. 3A and 3B show a side view of a reticle having the pattern shown in FIG. 2.

FIGS. 5A–5E show one method of fabrication of a reticle having the pattern shown in FIG. 2.

FIGS. 7A–7F show a further method of fabrication of a reticle having the pattern shown in FIG. 2.

FIGS. 8A–8F show a further method of fabrication of a reticle having the pattern shown in FIG. 2.

FIGS. 9A–9E show a further method of fabrication of a reticle having the pattern shown in FIG. 2.

DETAILED DESCRIPTION OF PRESENT INVENTION

Figure 1A:
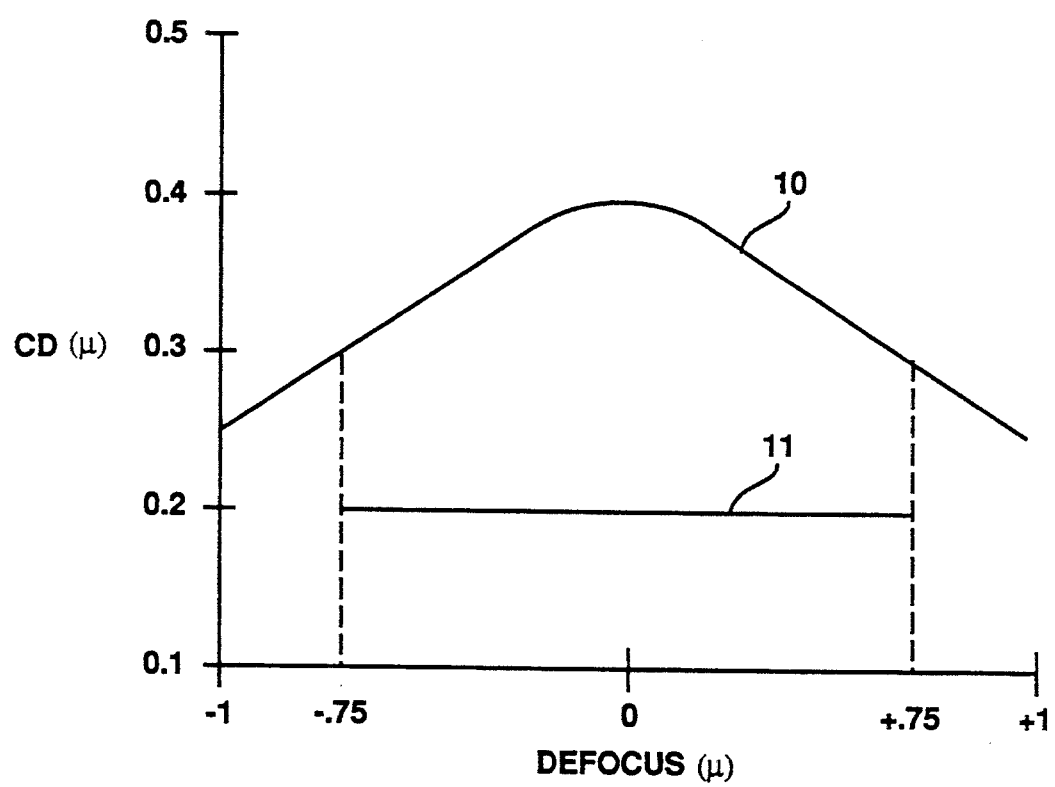
FIGS. 1A and 1B show a graphical representation of defocus verses critical dimension of an opening in a positive photoresist layer.

An inverted phase-shifted reticle with structurally identical features is disclosed. In the following description, numerous specific details are set forth such as specific materials, reticle patterns, dimensions, etc. in order to provide a thorough understanding of the present invention. It will be obvious, however, to one skilled in the an that these specific details need not be employed to practice the present invention. In other instances, well known materials or methods have not been described in detail in order to avoid unnecessarily obscuring the present invention.

A variety of patterned resist layers may be formed. The present invention may be used to pattern a resist layer having dimensions larger or smaller than the conventional resolution limit. The patterned resist layer may be used as a masking layer during a dielectric, silicon, or metal etch step, or as a masking layer during a doping step or at other processing steps. A large number of patterns can be formed using the present invention. A patterned resist layer may be used for defining contact or via openings, polysilicon word lines, metal lines, field isolation regions, ion implanted regions, etc. Patterns that can be formed by the present invention are not limited to the examples given. The present invention is illustrated herein in connection with an opening pattern having an approximately square or rectangular opening surrounded by a phase-shifting rim. It will readily be appreciated that a reticle according to the present invention can be fabricated having different patterns with phase-shifting elements other than phase-shifting rims. The present invention may be used with any semiconductor technology including bipolar, metal-oxide-semiconductor, and III–V semiconductors.

A variety of materials and equipment can be used. Although the present invention is described in conjunction with a positive photoresist, it will readily be appreciated that the present invention may be practiced using any type of photosensitive layer, including positive photoresist, negative photoresist, contrast enhanced photoresist, and resist materials that are patterned using radiation having a wavelength outside of the visible light spectrum. Other materials, such as an anti-reflective coating, for example, may be used with a resist layer. The reticle may be made of many different materials. A reticle base or substrate may comprise quartz, glass, silicon, silicon nitride, silicon oxynitride, or boron nitride. Chrome, gold, copper, and other metallic compounds may be used for an opaque element. A polysilicon stencil or "see through" reticle may be used, although the reticle may be more difficult to manufacture. Any material that is opaque to the radiation may be used as an opaque element. In the embodiments described herein, the reticle base is made of quartz and the opaque regions comprise a patterned chrome layer of sufficient thickness to block substantially all radiation. In a preferred embodiment, phase-shifting is accomplished through use of regions of different quartz thicknesses as described below. Alternatively, phase-shifting may be accomplished by forming regions of other materials in the reticle region where phase-shifting is desired. For example, phase-shifting may be accomplished by placing a material including photoresist, silicon dioxide (doped or undoped), spin-on-glass, polyimide, silicon nitride, silicon oxynitride, and poly (methyl methacrylate) in the appropriate region.

The present invention may be used with any lithographic printer regardless of radiation wavelength and numerical aperture. Examples of lithographic printers include projection printers, contact printers, and proximity printers. Commercially available lithographic printers typically operate at a wavelength $\lambda$ no longer than approximately 436 nm and have a lens with a numerical aperture (NA) in the range of approximately 0.17 through 0.6 and an image reduction factor in the range of approximately $1 \times 1$ through $10 \times 1$.

In a currently preferred embodiment of the present invention, a semiconductor substrate is coated with a positive photoresist layer and is placed in a lithographic printer. In a currently preferred embodiment, the lithographic printer is a projection printer, such as a Nikon/-line projection printer, having a radiation source that emits radiation having a wavelength of approximately 365 nm, a lens with a numerical aperture of approximately 0.50 and an image reduction factor (IRF) of approximately $5 \times 1$. The $5 \times 1$ image reduction factor means that an image on the reticle is reduced by about five times when the image reaches the surface of the photoresist layer. For simplicity, features and patterns on the reticle will be described based on the size of the formed image, taking into account the IRF of the printer. For example, when the radiation intensity at the photoresist surface is discussed in relation to a reticle feature, reference will be made to, for example, the intensity of radiation "under an opening" of the reticle. This terminology is used to describe the intensity of radiation on the photoresist surface at the corresponding $\frac{1}{5}$ size image. Thus, all dimensions described herein are on a 1:1 basis unless noted otherwise. To determine the corresponding size of the feature or patterns on the reticle, the 1:1 size should be multiplied by approximately 5. Additionally, it has been found that to make a feature of a given size in positive photoresist, the size of the feature on the reticle should be approximately 20% larger than the desired feature size times the IRF of the printer for the inverted phase-shifted reticle of the present invention. Typically, on a 1:1 basis, the size of a feature on the reticle, such as a contact opening, is typically in the range of approximately 0.5 IRF$\lambda$/NA, while the width of a phase shifting element is typically in the range of approximately 0.1–0.4 IRF$\lambda$/NA.

As is well known in the art, when light travels through a medium having an index of refraction greater than that of air, its phase is shifted relative to light which has not traveled through the medium. The degree of the phase-shift is dependent upon the index of refraction of the particular material, the wavelength of the light and the thickness of the material. In a preferred embodiment, light from a phase-shifting element is shifted relative to other proximate regions by varying the thickness of the quartz plate 20. Alternatively, phase-shifting can be accomplished by adding a thickness of a material as described earlier, or by a combination of removal and addition of material. For convenience, some regions are referred to as the 0° phase, and other regions are referred to as the 180° phase. It is understood that for the purpose of eliminating or reducing the effects of diffraction these phases do not correspond to any absolute phase-shifting through the reticle but only to the relative difference between the two regions. In general, regions which have had no quartz etched or have had a sufficient thickness of quartz etched to shift the phase of radiation an integer multiple of 360°, relative to radiation transmitted through un-etched quartz, are referred to as the 0° phase. Regions which have had sufficient quartz etched to shift the phase of radiation 180° or 180° plus an integer multiple of 360° relative to radiation transmitted through un-etched quartz are referred to as the 180° phase. Furthermore, for the phase-shifted reticle to be effective, the phase difference between a phase-shifting element and a proximate or adjacent opening does not need to be exactly 180° but may be anywhere between approximately 160°–200° (or 160°–200° plus a multiple of 360°). Finally, it will be understood by one skilled in the art that all of the 0° phase regions and all of the 180° phase regions over the entire surface of a reticle do not need to have a phase difference within the range of approximately 160°–200° from one another, but that adjacent 0° and 180° regions should have a phase difference within this range in order to be effective. Although only a relative difference of approximately 160°–200° is necessary for purposes of eliminating or reducing diffraction, it should be borne in mind that the direction of phase difference (i.e., whether one region shifts the phase 160°–200° more than another region or whether it shifts the phase 160°–200° less than another region) is important to the practice of the present invention as explained more fully below.

Figure 2:
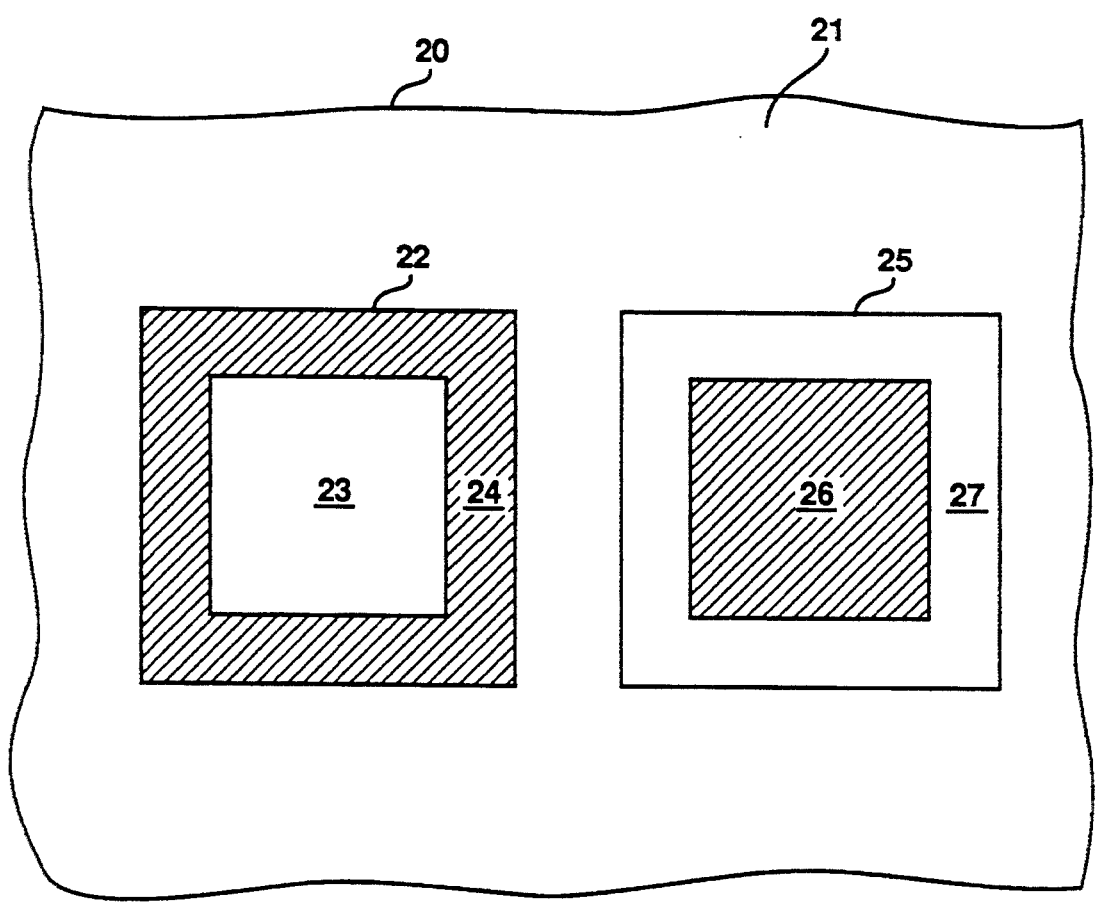
FIG. 2 shows a top view of a portion of a reticle formed in accordance with a currently preferred embodiment of the present invention.

FIG. 2 shows a portion of a reticle formed in accordance with a currently preferred embodiment. The reticle comprises quartz plate 20, chrome element 21, and opening patterns 22 and 25. Opening pattern 22 comprises opening 23 and phase-shifting rim 24. Opening pattern 25 comprises opening 26 and phase-shifting rim 27. Opening 23 is the 0° phase while phase-shifting rim 24 is the 180° phase. Thus, an opening of below conventional resolution can be formed by opening pattern 22 by virtue of the phase-shifting rim 24. Similarly, for opening pattern 25, opening 26 is the 180° phase while phase-shifting rim 27 is the 0° phase. Since these two regions are 180° out of phase, a subconventional resolution opening can be formed in the photoresist by opening pattern 25.

Also, since phase-shifting rim 24 of opening pattern 22 is "inverted" relative to phase-shifting rim 27 of opening pattern 25, the problem of an unacceptably high exposure intensity between two adjacent or closely spaced contact patterns does not occur. Radiation transmitted through phase-shifting rim 24 interferes with radiation transmitted through phase-shifting rim 27, causing the intensity between opening 23 and opening 26 to be low, such that the photoresist between the openings is not significantly exposed.

Although the present invention is described in conjunction with two proximate inverted rim phase-shifted patterns with a portion of chrome 21 therebetween, the present invention may be practiced on two adjacent (i.e., no chrome between the patterns) such patterns, as well as two proximate or adjacent patterns other than the opening patterns described herein. For example, the present invention as described herein is equally applicable to two adjacent or closely spaced line patterns.

In the following description of the structures and methods used to produce the structures of the present invention, shorthand terminology will be employed in order to simplify the discussion. As described above, phase-shifting in a currently preferred embodiment of the present invention is accomplished by removing a thickness of quartz from one or both of the opening and phase-shifter region such that radiation transmitted through the opening and phase-shifter is 180° out of phase. In order to denote a region where sufficient quartz has been removed to phase-shift radiation a nominal 180°, terminology such as "180° of quartz has been removed" will be employed. Similarly, regions on the mask which have had 180° of quartz removed compared with another region will be referred to as "180° below" the other region, while the other region will be referred to as "180° above" the region with 180° of quartz removed.

A side view of one reticle having the pattern shown in FIG. 2 is shown in FIGS. 3A and 3B. The reticles shown in FIGS. 3A and 3B have the inverted relationship described above, allowing the pattern to be placed closely together. However, the reticles of FIGS. 3A and 3B will have the problem of focal shift in opposite directions as described in the background section, if the quartz etch introduces any phase error. This is due to the fact that the direction of phase error depends on the structure of a feature and the shifter. That is, the direction of phase error will depend on whether a feature or the shifter is a nominal +180° structure or a nominal −180° structure. The denomination of one structure as a +180° structure and the other as a −180° is arbitrary and could be reversed, so long as the nomenclature is consistent. Herein, structures having a rim above the opening will be considered phase-shifted in a positive direction (i.e., +180° structures). Referring to FIG. 3A, opening pattern 22a can be considered a +180° structure, since rim 24a is 180° above opening 23a, while opening pattern 25 can be considered a −180° structure, since rim 27a is 180° below opening 26a. That is, radiation transmitted through rim 24a is phase-shifted +180° relative to radiation transmitted through opening 23a, and radiation transmitted through rim 27a is phase-shifted −180° relative to radiation transmitted through opening 26a.

Referring to FIG. 3A, if the quartz etch used to phase-shift opening 23a of pattern 22a and phase-shifting rim 27a of pattern 25a, removed, for example, only 170° of quartz from these regions, the following would be observed. Rim 24a would be phase-shifted +170° in relation to opening 23a, and rim 27a would be phase-shifted −170° in relation to opening 26a. The −170° phase-shift between rim 27a and opening 26a is optically equivalent to a phase-shifting +190°. Therefore, pattern 22a would have a phase error of −10°, while pattern 25a would have a phase error of +10°. The defocus versus CD curve for opening pattern 22a would shift right (as with curve 12 of FIG. 1B), and the defocus versus CD curve for opening pattern 25a would shift left (as with curve 13 of FIG. 1B). Thus, even though both opening patterns have an identical amount of quartz removed, the phase-error and therefore the focal shift would be in opposite directions, resulting in a narrow depth of field as described earlier. Similarly, if the quartz etch used to phase-shift opening 23a and rim 27a removed, for example, 190° of quartz, the curve for opening pattern 22a would shift left, while the curve for opening pattern 25a would shift right. Referring now to FIG. 3B, a similar result is obtained. If, for example, 180° of quartz is removed from phase-shifting rim 24b of opening pattern 22b, and opening 26b of opening pattern 25b, and 350° of quartz is removed from opening 23b of opening pattern 22b and phase-shifting rim 27b of opening pattern 25b (i.e., a phase difference of +170° for pattern 22b and −170° for pattern 25b), the focal shift will be in opposite directions again. That is, the curve of defocus versus CD for opening 22b will shift to the left, while that for opening 25b will shift to the left. Similarly, if for example, regions 24b and 26b have 180° of quartz removed, while regions 23b and 27b have 370° of quartz removed, the respective defocus versus CD curves would again shift in opposite directions. In this situation the curve for 22b would shift left while the curve for 25b would shift right. Again, the depth of field would be greatly diminished as with the example in FIG. 3A.

As can be seen therefore from FIGS. 3A and 3B and the discussion thereof, even if all patterns have a uniform quartz height difference between the rim and the opening, that is, all features have a difference in quartz height of greater than 180° or all patterns have a difference in quartz height of less than 180°, the depth of field can still be greatly reduced due to the fact that the focal shift is in opposite directions for the two patterns. This will occur whenever two phase-shifted features are structurally different. Structurally different as used herein means that the relationship between a feature and its phase-shifting element in terms of direction of phase shift, is opposite for two features. For example, in FIG. 3A, for opening pattern 22a, the opening 23a is 180° below phase-shifting rim 24a, while for opening 25a, opening 26a is 180° above phase-shifting rim 27a.

Figure 4A:
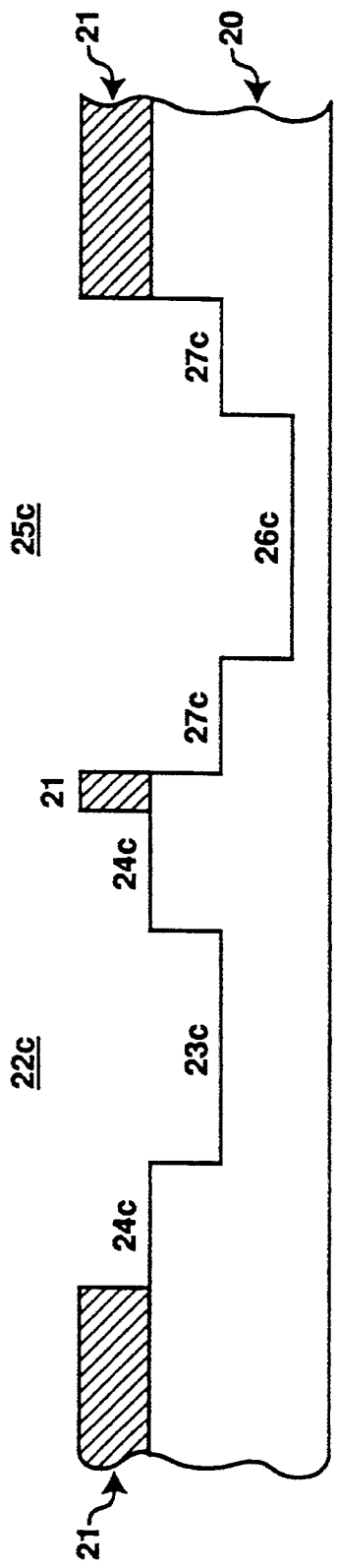
FIGS. 4A and 4B show side views of currently preferred embodiments of a reticle having the pattern shown in FIG. 2.
Figure 4B:
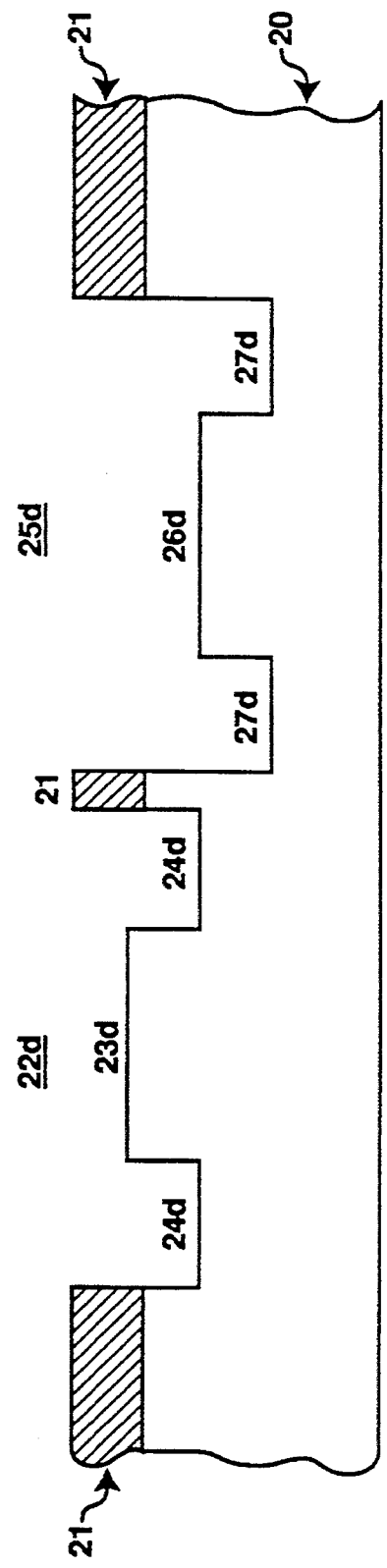

FIGS. 4A and 4B are two currently preferred embodiments of the present invention which overcome the above-described problem of focal shift in opposite directions. Methods of forming the structure of FIG. 4A are described in conjunction with FIGS. 5–7. Referring to FIG. 4A, assume for example, that each of rim 24c and 27c is approximately 170° above its respective opening (and that rim 24c is approximately 160°–200° above rim 27c such that the patterns are inverted). Thus, as with the embodiments in FIG. 3A and 3B, there is a uniform amount of quartz removed. Unlike the embodiments of FIG. 3, in FIG. 4 this results in a uniform phase error ($-10°$ in this example). In this situation, where the phase difference is less than 180°, the focal shift for both opening pattern 22c and 25c will be to the fight. Similarly, if the phase error is greater than 180°, the focal shift for both patterns will be to the left.

Referring now to FIG. 4B, assume, for example, that each rims 24d and 27d is approximately 170° below its respective opening (and that rim 24d is approximately 160°-200° above rim 27c). Again, there is a uniform quartz height difference between each opening and rim. In this case, the phase difference between an opening and its phase-shifting rim is now $-170°$ for both patterns (equivalent to $+190°$), so that the phase-error is $+10°$ for both patterns. In this case, both of opening patterns 22d and 25d will experience a focal shift to the left. If each rim had been 190° below its reflective opening (i.e., phase-shifted $-190°$ which is equivalent to $+170°$), the phase error would be $-10°$, and both of patterns 22d and 25d would experience a focal-shift to the right.

The two opening patterns in each of FIGS. 4A and 4B are considered to be structurally identical to each other. For example, in FIG. 4A, each rim 24c and 27c is a nominal 180° above its respective opening 23c and 26c. Both of patterns 22c and 25c are, as described earlier, $+180°$ structures. In FIG. 4B, each phase-shifting rim 24d and 27d is a nominal 180° below the respective openings 23d and 26d. Both of patterns 22d and 25d are, as described earlier, $-180°$ structures. So long as two inverted phase shifted patterns are structurally identical as described above, the phase error due to a quartz height difference of less than 180° or more than 180° will be in the same direction, and the depth of field will not be significantly reduced due to focal shift in opposite directions as with the structures of FIGS. 3A and 3B. Note that any of the structures in FIGS. 3 and 4, would achieve the benefits of the inverted rim structure shown in FIG. 2. However, only structurally identical patterns, will additionally achieve the benefit of focal shift in the same direction. Furthermore, the structurally identical relationship is not limited to that shown in FIGS. 4A and 4B. All patterns which are $+180°$ structures are structurally identical to one another, and all patterns which are $-180°$ structures are structurally identical to one another. Additionally, all structures with the phase-shifting rim 180° $+n$ 360°, n being an integer of 0 or greater, above the opening are $+180°$ structures. Similarly, all structures which have the phase-shifting rim 180° $+n$ 360° below the opening are $-180°$ structures. For example, both patterns 22d and 25d of FIG. 4B, could have openings 23d and 26d above their respective phase-shifting rims by 180° plus any multiple of 360° and still be $-180°$ structures. Structurally identical features, as defined above, are therefore ones for which the phase difference between a rim and its opening is in the same direction for each of such features. For the currently preferred embodiment shown in FIG. 4A and other equivalent 180° structures, radiation passing through the phase-shifting rims 24c or 27c is phase-shifted 180° (or 180° plus an integer multiple of 360°) more than radiation passing through the openings 23c or 26c. For the embodiment shown in FIG. 4B, and the equivalent $-180°$ structures, radiation passing through the phase-shifting rims 24d or 27d is phase-shifted 180° (or 180° plus an integer multiple of 360°) less than radiation passing through the openings 23d or 26d. As is readily apparent, numerous other configurations beyond those shown and described could be utilized wherein two adjacent patterns maintain an inverted relationship while being structurally identical. Generally, the structures shown in FIGS. 4A and 4B will be the easiest to manufacture, and will more likely have relatively uniform phase error.

The methods of the present invention are not limited to the specific embodiments shown herein. For example, the patterns shown in the parent applications of the present application could be formed by the method of the present invention, as well as any other pattern where it is desired to phase shift closely spaced features.

It should be noted that in order to eliminate focal-shift in opposite directions, any phase-error must be in the same direction for all features on a reticle. Generally speaking, this can most easily be accomplished by forming structurally identical features as described above. This is because methods of introducing a phase-shift, such as etching the reticle or depositing a thickness of material where phase-shifting is desired typically remove or add a uniform mount of material. However, the teachings of the present invention can be used to repair reticles having focal-shift in opposite directions, due to, for example, structurally different features. For example, if an etch removes 190° of quartz, all nominal $+180°$ structures will have a phase-error of $+10°$, while all nominal $-180°$ structures will have a phase-error of $-10°$. In order to create a uniform phase error, the nominal '180° structures and the openings of nominal $+180°$ structures can be masked while an additional 20° of quartz is removed from phase-shifting rims of the nominal $+180°$ structures. After this 20° of quartz is removed from the rims of the nominal $+180°$ structures, all structures will have a phase error of $-10°$, resulting in focal shift in the same direction for all features. Alternatively, an appropriate thickness of additional material (e.g. $SiO_2$, silicon nitride, etc.) could be added to appropriate regions in accordance with the teachings herein to cause any phase error to be uniform.

FIGS. 5-9 show several alternate methods of the fabrication of a reticle having the pattern shown in FIG. 2, with the structure shown in FIG. 4A or 4B. In the following methods, the pattern of FIG. 2 is used for illustration. It will be obvious, however, that the methods described below could be used to fabricate any of the patterns within the scope of the present invention. Furthermore, although methods of fabricating the structures shown in 4A and 4B are disclosed, it will be understood that the same methods, with minor modifications, could be used to fabricate other structures within the present invention as described earlier. As described earlier, shorthand terminology such as etching 180° of quartz will be used to denote an etching step wherein a thickness of quartz sufficient to phase-shifting radiation of wavelength λ, a nominal 180° is removed. It will be understood that the value of 180° is the nominal or target value and the etch need only remove a thickness of quartz sufficient to phase-shift radiation 160°-200°.

In a preferred embodiment, the reticle is formed on a quartz substrate having a chrome layer thereon. In the etch steps described below, the quartz is etched in a dry plasma etch and the chrome is etched in a wet chemical etch. The chrome and quartz etches are performed by methods well known in the art. It will be obvious, however, that the methods could be used to fabricate a reticle according to the present invention on other substrates having other opaque layers, such as those described earlier, using well known methods to etch the selected materials.

Figure 5E:
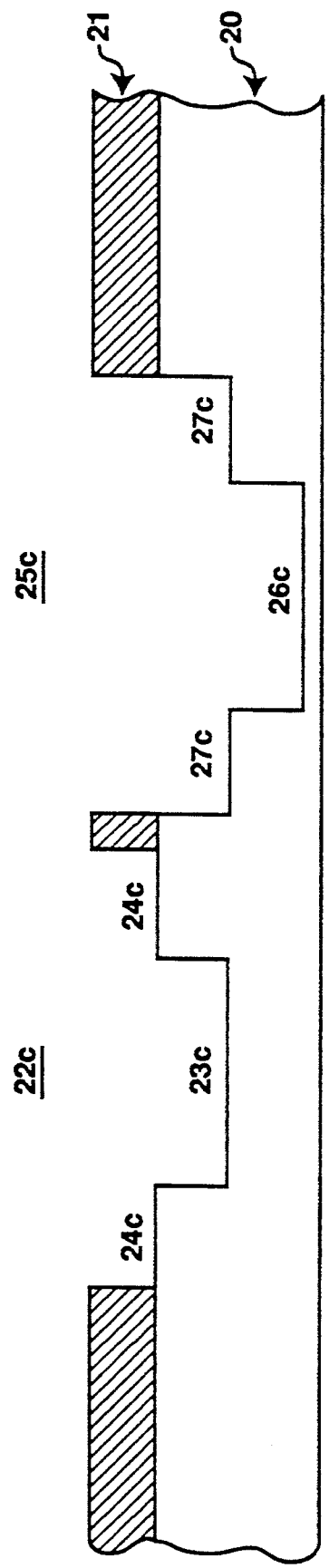

FIGS. 5A–5E illustrate a method of fabricating the structurally identical inverted phase-shifted reticle of the present invention. First, as shown in FIG. 5A, patterning layer 50 with openings 51 is formed on quartz substrate 20 and chrome layer 21. The openings 51 correspond to the openings 23c and 26c of FIG. 4A.

Next, a chrome undercut etch is performed as shown in FIG. 5B. The regions 52 where chrome is removed in the undercut etch correspond to rims 24c and 27c of FIG. 4A. Referring to FIG. 5C, a quartz etch is performed to remove a 180° of quartz substrate 20. In this etch, quartz is removed from the region directly underlying openings 51, but not from the regions underlying region 52, since the dry etch is anisotropic.

Next, patterning layer 50 is removed, followed by patterning layer 55 having opening 56 as shown in FIG. 5D. The structure of FIG. 5D is then subjected to a quartz etch to remove 180° of quartz from all regions exposed by opening 56. After removal of the patterning layer 55, the resulting structure is shown in FIG. 5E.

As can be seen from FIGS. 5A–5E and the above description, the method of FIGS. 5A–5E does not require the formation of a rim-shaped opening, which is not a conventional CAD pattern. Furthermore, the method shown in FIGS. 5A–5E is virtually self-aligned. That is, after the initial patterning of masking layer 50 of FIG. 5A, all further chrome and quartz etch steps are automatically aligned to the pattern of FIG. 5A, with only coarse alignment of patterning layer 55. Them is no need for precision alignment methods to ensure alignment of a phase-shifting rim to its corresponding opening, for example.

Note that with the structure formed in FIGS. 5A–5E, if there is phase error, the problem of focal shift in opposite directions is avoided, since both patterns are structurally identical, and both patterns will have the same phase error. For example, after the quartz etch shown in FIG. 5C, assume that only 160° of quartz is removed, resulting in a phase error of $-20°$. Since the quartz etch is relatively uniform over a reticle, all opening patterns will have substantially the same amount of quartz etched in this step, and therefore the phase error will be approximately equal in magnitude and will be in the same direction. Thus, all opening patterns in the reticle will have an opening 160° below the phase-shifting rim. Further, in the next etch step illustrated in FIGS. 5D–5E, an equal amount of quartz is etched from the opening and phase-shifting rim of the pattern on the right. Thus, the 160° difference between opening and rim will be maintained regardless of the amount of quartz etched in the second etch. Of course, although the amount of material etched in the second etch cannot affect the structural identity of the two patterns, it should remove 160°–200° of quartz so that the two proximate phase-shifting rims are sufficiently out of phase.

Figure 6A:
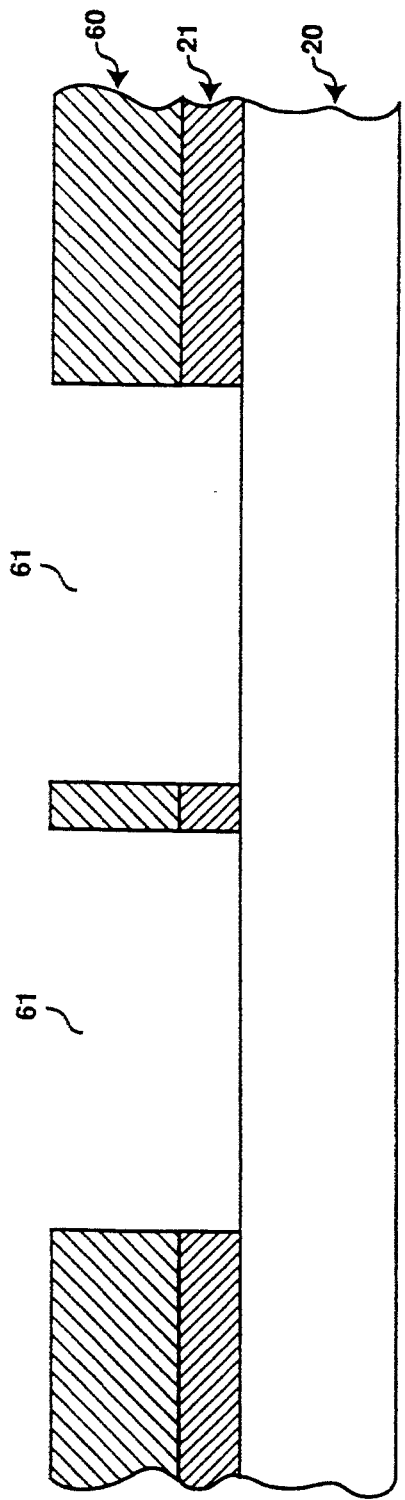
FIGS. 6A–6C show a further method of fabrication of a reticle having the pattern shown in FIG. 2.
Figure 6B:
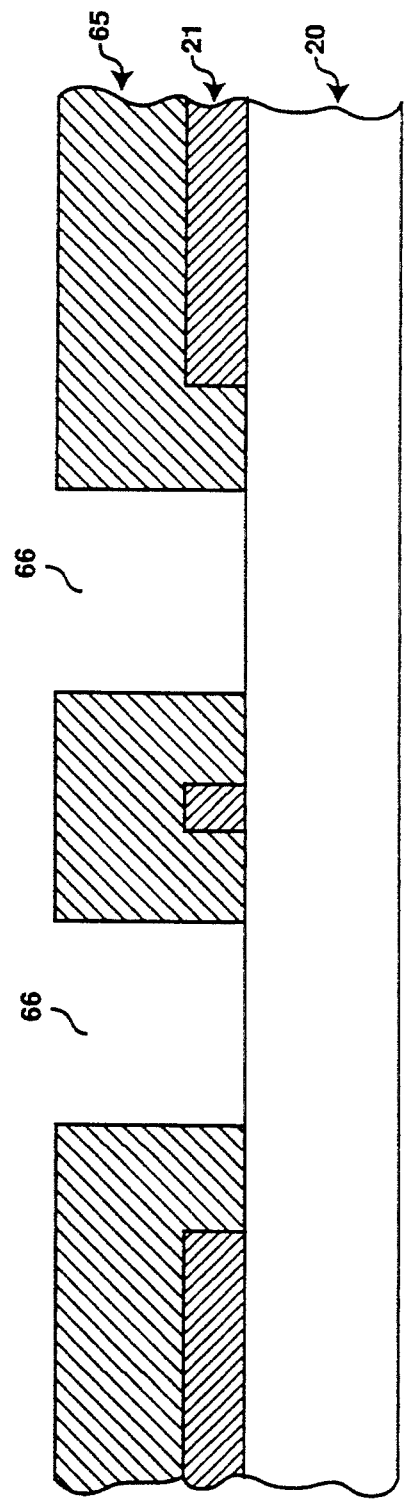
Figure 6C:
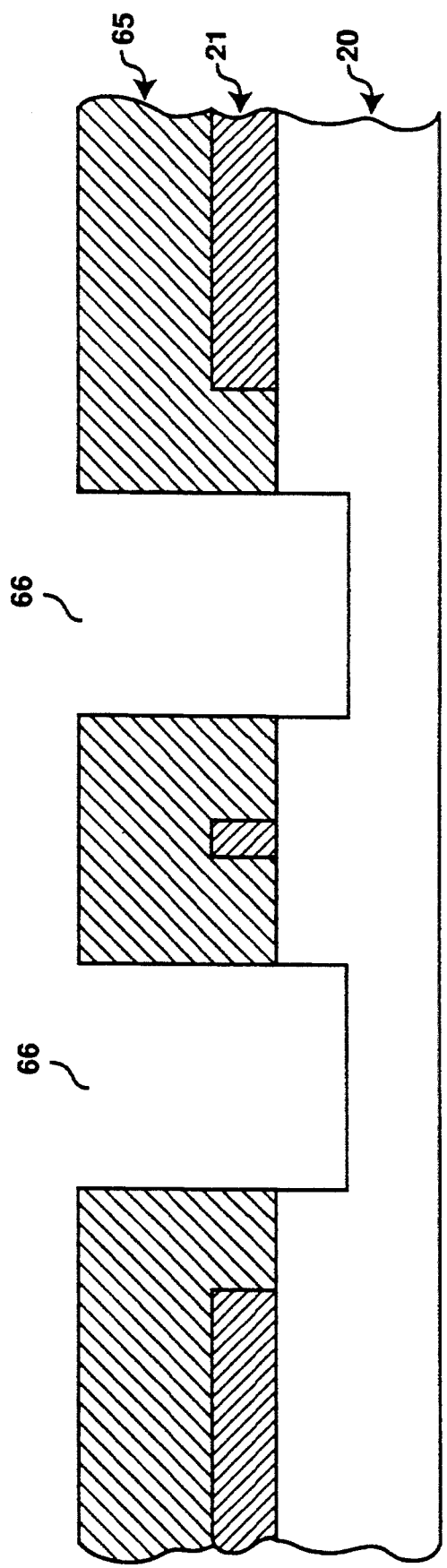

An alternative method to fabricate the reticle of the present invention is illustrated in FIGS. 6A–6C and FIGS. 5D–5E. First, as shown in FIG. 6A, a patterning layer 60 with openings 61 is formed on quartz substrate 20 and chrome layer 21. The openings 61 expose the regions corresponding to openings 23c and 26c and rims 24c and 27c of FIG. 4A. Next, a chrome etch is performed to remove the chrome from the regions exposed by openings 61. The resulting structure is shown in FIG. 6A. Next, patterning layer 60 is removed and patterning layer 65 with openings 66 is formed as shown in FIG. 6B. The openings 66 expose the region corresponding to openings 23c and 26c. Note that in this embodiment, the second patterning layer 65 must be precisely aligned so that openings 66 are centered in the chrome openings formed in the preceding chrome etch. Next, a quartz etch is performed to remove 180° of quartz. The resulting structure is shown in FIG. 6c. After removal of patterning layer 65, the structure of FIG. 6c is processed as described above in conjunction with FIGS. 5D and 5E. While the embodiment shown in FIGS. 6A–6C and 5D–5E is not self-aligned, it does not require the chrome undercut etch as in the embodiment shown in FIGS. 5A–5E. As with the previous method, the above embodiment does not require unconventional CAD features. Note that in this method, as with the prior method, the phase difference between each opening and its phase-shifting rim is determined in a single etch step, which is shown in FIGS. 6B and 6C. Therefore, any phase error will be approximately the same for all patterns.

Figure 7C:
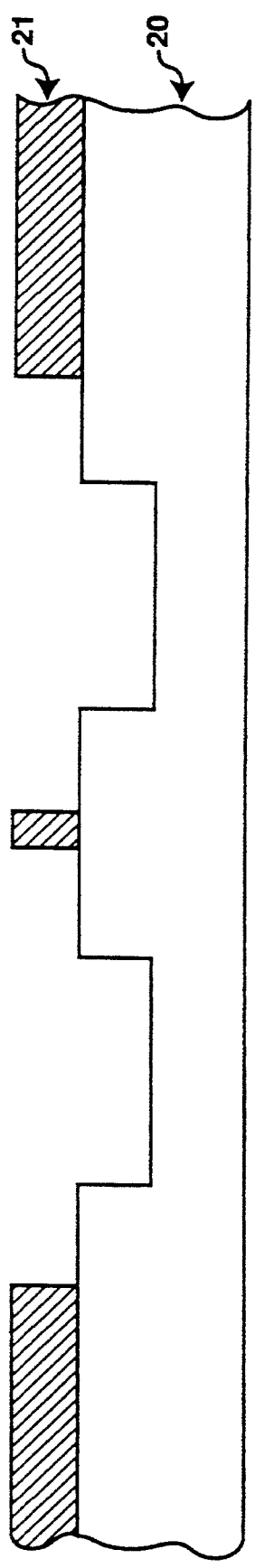

FIGS. 7A–7F show further alternate method of forming a reticle according to the present invention. First, patterning layer 70 with openings 71 is formed on quartz substrate 20 and chrome layer 21. Next, the chrome etch is performed to remove the chrome in the regions exposed by openings 71. This is followed by a quartz etch to remove 180° of quartz in the regions exposed by openings 71. The resulting structure is shown in FIG. 7A. Patterning layer 70 is then removed.

Figure 7D:
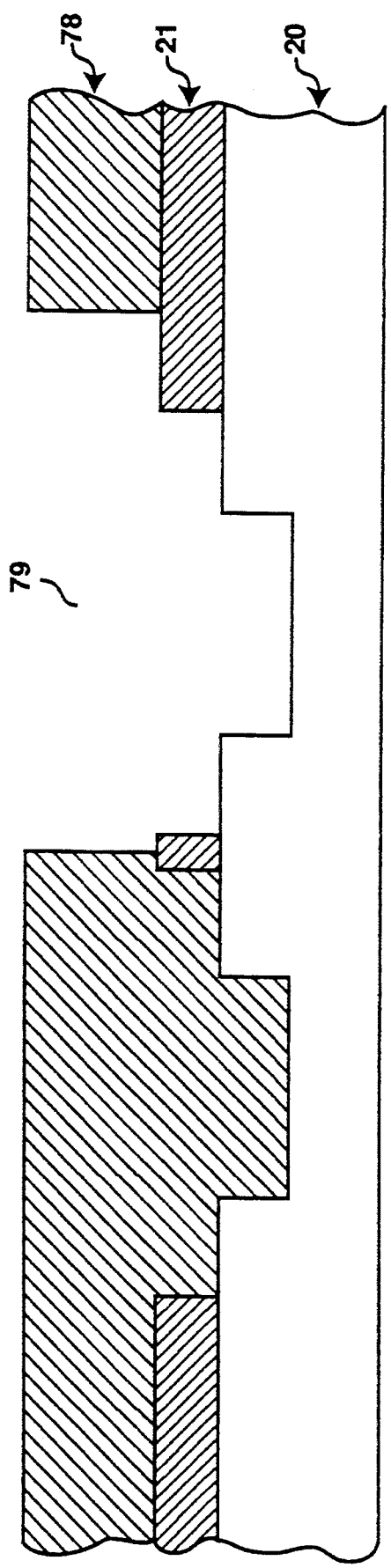

Next, as shown in FIG. 7B patterning layer 75 with openings 76 is formed on quartz substrate 20. This is followed by a chrome etch to remove the chrome additionally exposed by openings 76, corresponding to the phase-shifting rims. The resulting structure after removal of patterning layer 75 is shown in FIG. 7C. Note that the above patterning layer 75 must be aligned precisely around the openings in quartz substrate 20 formed in the step shown in FIG. 7A, to ensure that the phase-shifting rims are centered precisely around the openings. Referring to FIG. 7D, a third patterning layer 78 with opening 79 is formed. A second quartz etch is performed to remove an additional 180° of quartz from the region of quartz substrate 20 exposed by opening 79. The resulting structure is shown in FIG. 7E. After removal of patterning layer 78 the resulting structure is shown in FIG. 7F. Again this corresponds to the structure of FIG. 4A.

Figure 8C:
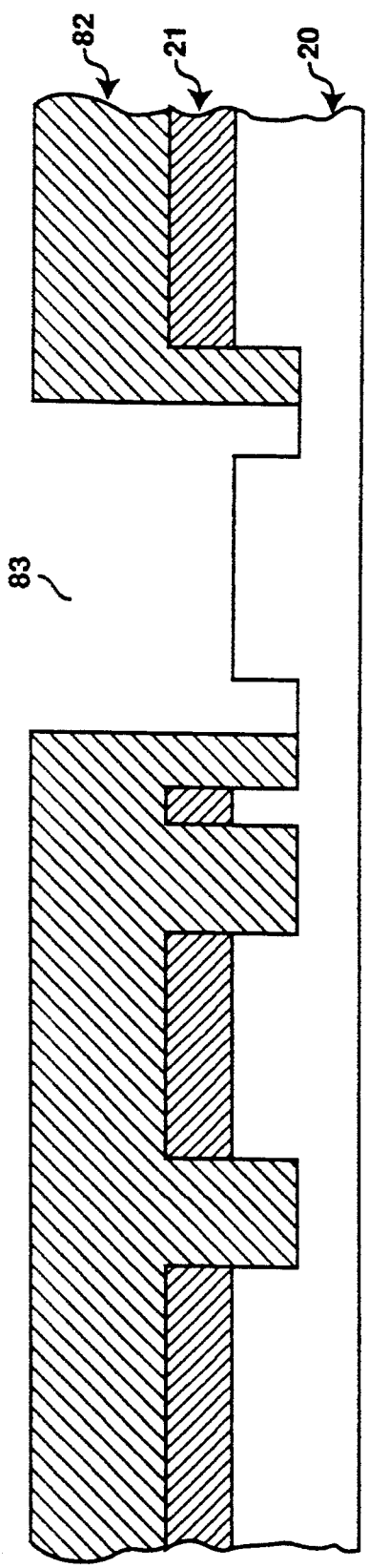
Figure 8D:
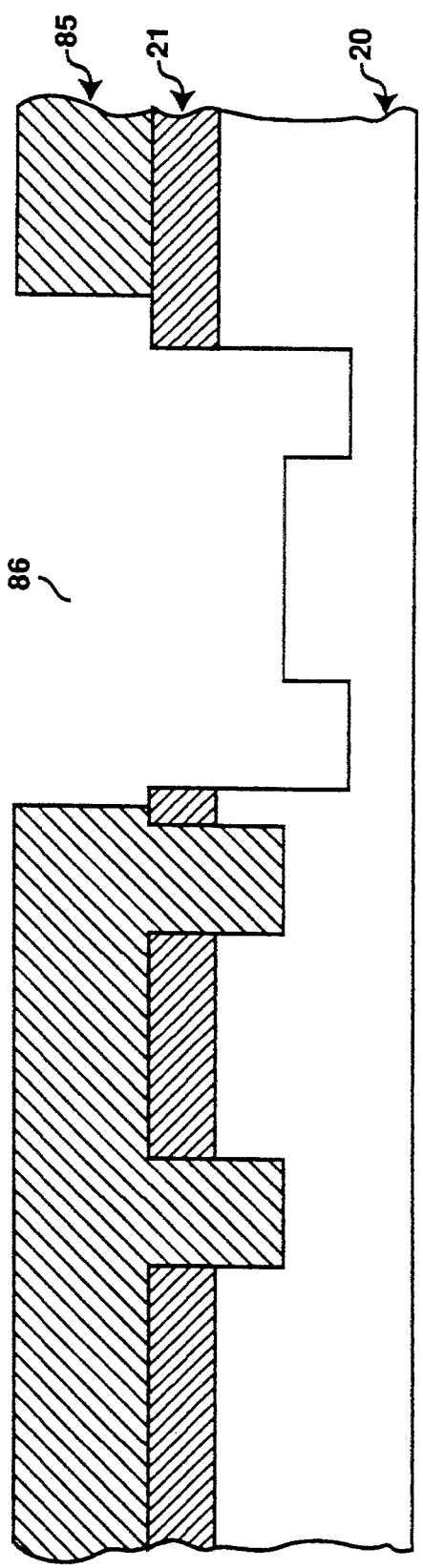

FIGS. 8 and 9 illustrate two methods of fabricating the structure of FIG. 4B. First as shown in FIG. 8A photoresist layer 80 having openings 81 is formed on quartz substrate 20 and chrome layer 21. Next, chrome layer 21 is etched in the regions exposed by openings 81 as shown in FIG. 8A. The chrome etch is followed by a quartz etch, to remove 180° of quartz from the regions exposed by openings 81. The resulting structure is shown in FIG. 8B. The regions with quartz etched at this stage correspond to phase-shifting rims 24d and 27d. This etch step defines the phase difference between each opening and its rim. Therefore, as with the previous methods, any phase error will be approximately the same for all patterns. Next, patterning layer 80 is removed followed by formation of patterning layer 82 with opening 83 as shown in FIG. 8C. Next, a chrome etch is performed to remove the chrome exposed by opening 83, as shown in FIG. 8C. Patterning layer 82 is removed followed by formation of patterning layer 85 with opening 86. Opening 86 exposes the region which will be pattern 25d. Next a quartz etch is performed to remove 180° of quartz. The resulting structure is shown in FIG. 8D. Next, patterning layer 85 is removed followed by formation of patterning layer 87 having opening 88. The chrome in the regions exposed by opening 88 is then removed as shown in FIG. 8E. After removal of patterning layer 87 the final structure is shown in FIG. 8F.

Note that the above described method does not require any critical alignment steps. For example, after formation of the phase-shifting rims as shown in FIG. 8B, patterning layer 82 need only be aligned such that the chrome above what will become opening 26d exposed. Similarly prior to the second quartz etch of FIG. 8D, patterning layer 85 need only be aligned such that opening 86 is roughly centered about pattern 25d. Also, patterning layer 87 need only be aligned such that opening 88 is centered about what will be opening 23d. In all these steps the corresponding opening in the photoresist is larger than the region to be etched.

Figure 9A:
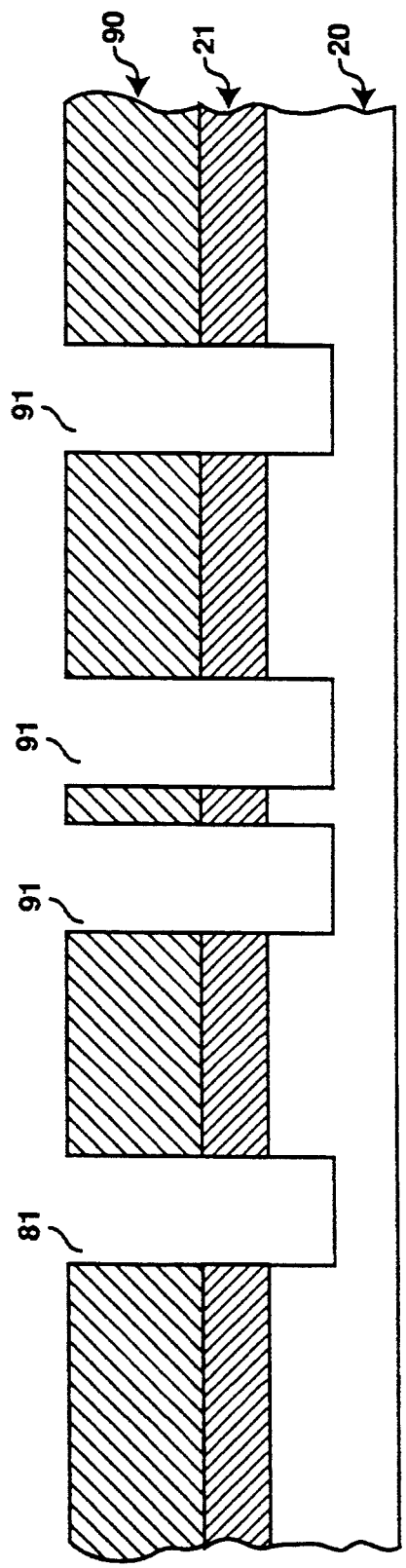

FIGS. 9A-9D illustrate a further alternate method of fabricating the reticle of the present invention. First, quartz substrate 20 having chrome layer 21 is patterned with a patterning layer 90, having openings 91. Openings 91 correspond to the locations of, for example, the phase-shifting rims of two adjacent contact patterns 22d and 25d. A chrome etch is then performed to remove the chrome from the regions exposed by openings 91, followed by a quartz etch designed to remove 180° of quartz substrate 20. The resulting structure is shown in FIG. 9A. This etch step defines the phase difference between each opening and its rim. Therefore, as with the previous methods, any phase error will be approximately the same for all patterns.

Figure 9B:
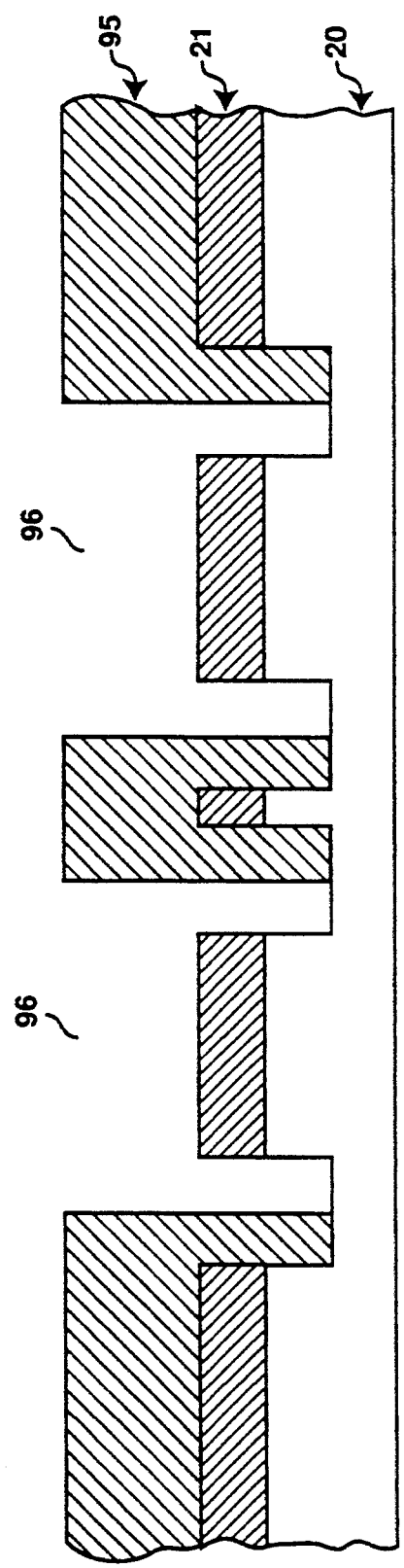

Next patterning layer 90 is removed and is followed by another patterning layer 95 having openings 96, exposing for example, the chrome overlying the locations the contact openings 23d and 26d, as shown in FIG. 9B. A chrome etch is then performed, followed by removal of patterning layer 95, resulting in the structure shown in FIG. 9C.

A third patterning layer 97 with opening 98 is then formed, as shown in FIG. 9D. Opening 98 exposes opening 26d and phase-shifting rim 27d.

A quartz etch is then performed on the structure of FIG. 9D. This etch removes 180° of quartz substrate 20 from the regions exposed by opening 98. After removal of masking layer 97, the reticle appears as shown in FIG. 9E.

Note that the method shown in FIGS. 9A-9E is virtually self-aligned. That is, after the initial patterning masking layer 90 of FIG. 9A, all further chrome and quartz etch steps are automatically aligned to the pattern of FIG. 11, with only coarse alignment of patterning layers 95 or 97. There is no need for precision alignment methods to ensure alignment of a phase-shifting rim to its corresponding opening, for example. Additionally the method of FIGS. 9A-9E avoids a chrome undercut etch.

Figure 1B:
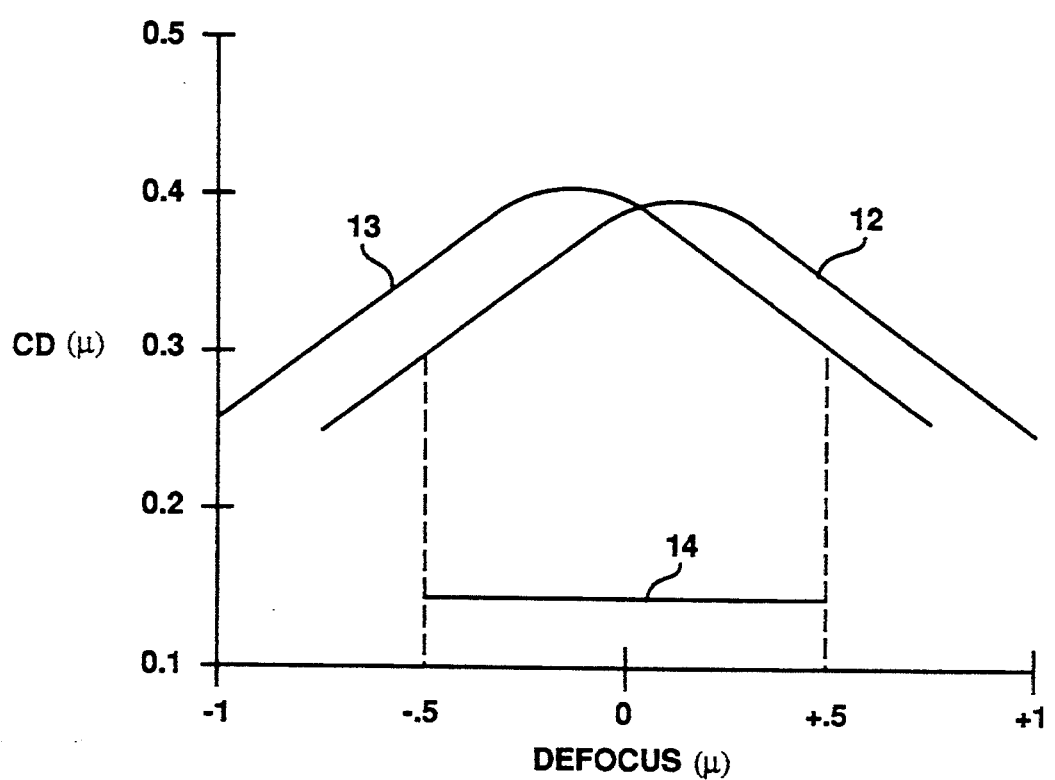

In the reticle of the present invention, as noted above, the phase error will be in the same direction and of approximately equal magnitude for all patterns. Because all patterns are structurally identical, the focal shift due to any phase error will be in the same direction. This in turn will result in a depth of field that is not narrowed due to focal shift in opposite directions as illustrated in FIG. 1B. Of course, there will be an offset to the left or the right, but this can be adjusted for by defocusing the reticle an equal amount during use.

Thus, an inverted phase-shifted reticle with closely spaced patterns, capable of forming below conventional resolution features without unacceptable exposure between the closely spaced features, has been described. The reticle of the present invention comprises closely spaced patterns which are structurally identical, thus preventing focal shift in opposite directions. Several methods of fabrication of a reticle according to the present invention are also disclosed.

What is claimed is:

1. A method of patterning a radiation sensitive layer comprising the steps of:

exposing a first region with radiation having a first phase;

exposing a second region proximate said first region with radiation having a second phase, said second phase shifted approximately 160-200 degrees relative to said first phase;

exposing a third region proximate said second region with radiation having a third phase, said third phase shifted approximately 160-200 degrees relative to said second phase; and, exposing a fourth region proximate said third region with radiation having a fourth phase, said fourth phase shifted approximately 160-200 degrees relative to said third phase, wherein if there is any phase error between said first and said second regions, and said fourth and said third regions, said phase error between said first and second region is in the same direction as said phase error between said fourth and said third region.

2. The method as described in claim 1 wherein said first region is adjacent to said second region, said second region is adjacent to said third region, and said third region is adjacent to said fourth region.

3. The method as described in claim 2 wherein said method is performed using a reticle, wherein said reticle is used on a lithographic printer having a numerical aperture (NA), an image reduction factor (IRF) and an exposing radiation wavelength ($\lambda$), wherein said second region comprises a phase shifting element for said first region, said third region comprises a phase shifting element for said fourth region.

4. The method as described in claim 1 wherein said first region is adjacent to said second region, said third region is adjacent to said fourth region, and wherein a portion of said radiation sensitive layer is exposed to substantially no radiation in a fifth region between said second and said third regions.

5. The method as described in claim 4 wherein said method is performed using a reticle, wherein said reticle is used on a lithographic printer having a numerical aperture (NA), an image reduction factor (IRF) and an exposing radiation wavelength ($\lambda$), wherein said second region comprises a phase shifting element for said first region, said third region comprises a phase shifting element for said fourth region, and wherein said second region is disposed within approximately 0.55 IRF*$\lambda$/NA of said third region.

6. The method as described in claim 1 wherein two opening patterns are formed in said radiation sensitive layer by said method.

7. The method as described in claim 6 wherein said opening patterns have a dimension of 0.5 micron or less.

8. The method as described in claim 7 wherein said method is performed using a reticle, wherein said reticle is used on a lithographic printer having a numerical aperture (NA), an image reduction factor (IRF) and an exposing radiation wavelength ($\lambda$), wherein said second region comprises a phase shifting element for said first region, said third region comprises a phase shifting element for said fourth region, and wherein said second region is disposed within approximately 0.55 IRF * 1/NA of said third region.

9. The method as described in claim 6 wherein said method is performed using a reticle, wherein said reticle is used on a lithographic printer having a numerical aperture (NA), an image reduction factor (IRF) and an exposing radiation wavelength ($\lambda$), wherein said second region comprises a phase shifting element for said fast region, said third region comprises a phase shifting element for said fourth region, and wherein said second region is disposed within approximately 0.55 IRF * 1/NA of said third region.

10. The method as described in claim 1 wherein two line patterns are formed in said radiation sensitive layer by said method.

11. The method as described in claim 10 wherein said line patterns have a dimension of 0.5 micron or less.

12. The method as described in claim 11 wherein said method is performed using a reticle, wherein said reticle is used on a lithographic printer having a numerical aperture (NA), an image reduction factor (IRF) and an exposing radiation wavelength ($\lambda$), wherein said second region comprises a phase shifting element for said fast region, said third region comprises a phase shifting element for said fourth region, and wherein said second region is disposed within approximately 0.55 IRF * 1/NA of said third region.

13. The method as described in claim 10 wherein said method is performed using a reticle, wherein said reticle is used on a lithographic printer having a numerical aperture (NA), an image reduction factor (IRF) and an exposing radiation wavelength ($\lambda$), wherein said second region comprises a phase shifting element for said first region, said third region comprises a phase shifting element for said fourth region, and wherein said second region is disposed within approximately 0.55 IRF * 1/NA of said third region.

14. The method as described in claim 1 wherein said method is performed using a reticle, wherein said reticle is used on a lithographic printer having a numerical aperture (NA), an image reduction factor (IRF) and an exposing radiation wavelength ($\lambda$), wherein said second region comprises a phase shifting element for said first region, said third region comprises a phase shifting element for said fourth region, and wherein said second region is disposed within approximately 0.55 IRF * 1/NA of said third region.

* * * * *